(12) United States Patent
Wang et al.

(10) Patent No.: US 8,683,420 B2
(45) Date of Patent: Mar. 25, 2014

(54) METHOD AND SYSTEM OF IMPROVED RELIABILITY TESTING

(75) Inventors: Yun Wang, San Jose, CA (US); Tony P. Chiang, Campbell, CA (US); Ryan Clarke, San Jose, CA (US); Chi-I Lang, Cupertino, CA (US); Yoram Schwarz, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 604 days.

(21) Appl. No.: 12/948,257

(22) Filed: Nov. 17, 2010

(65) Prior Publication Data

US 2012/0119768 A1 May 17, 2012

(51) Int. Cl.
*G06F 17/50* (2006.01)

(52) U.S. Cl.
USPC .......................................... 716/136; 716/100

(58) Field of Classification Search
USPC .......................................... 716/100–104, 136
See application file for complete search history.

(56) References Cited

U.S. PATENT DOCUMENTS

| 4,906,939 | A | 3/1990 | Berrigan et al. |
| 6,489,783 | B1 | 12/2002 | Liu et al. |
| 6,972,436 | B2 | 12/2005 | Das et al. |
| 2002/0030191 | A1* | 3/2002 | Das et al. ................. 257/77 |
| 2006/0113672 | A1* | 6/2006 | Wang et al. ............... 257/760 |
| 2007/0059883 | A1* | 3/2007 | Choi et al. ................ 438/258 |

OTHER PUBLICATIONS

Yamamichi, S., et al.; Impact of Time Dependent Dielectric Breakdown and Stress Induced Leakage Current on the Reliability of (Ba,Sr)TiO3 Thin Film Capacitors for Gbit-scale DRAMs; 1997; IEEE; pp. 261-264.

* cited by examiner

*Primary Examiner* — Binh Tat

(57) ABSTRACT

A method and system of improved reliability testing includes providing a first substrate and a second substrate, each substrate comprising only a first metallization layer; processing regions on a first substrate by combinatorially varying at least one of materials, unit processes, and process sequences; performing a first reliability test on the processed regions on the first substrate to generate first results; processing regions on a second substrate in a combinatorial manner by varying at least one of materials, unit processes, and process sequences based on the first results of the first reliability test; performing a second reliability test on the processed regions on the second substrate to generate second results; and determining whether the first substrate and the second substrate meet a predetermined quality threshold based on the second results.

13 Claims, 11 Drawing Sheets

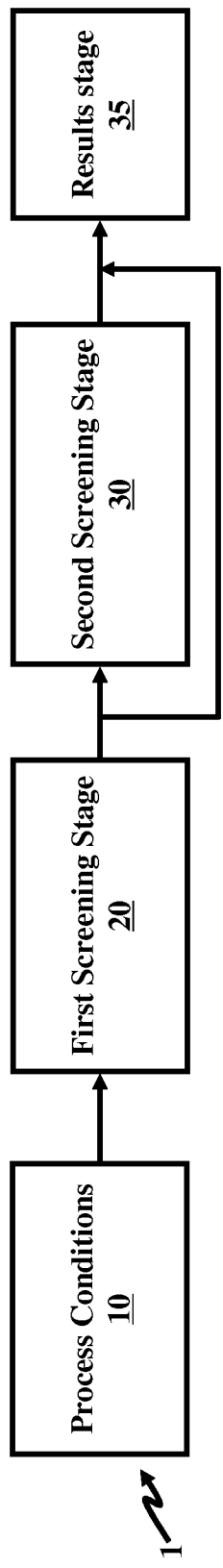
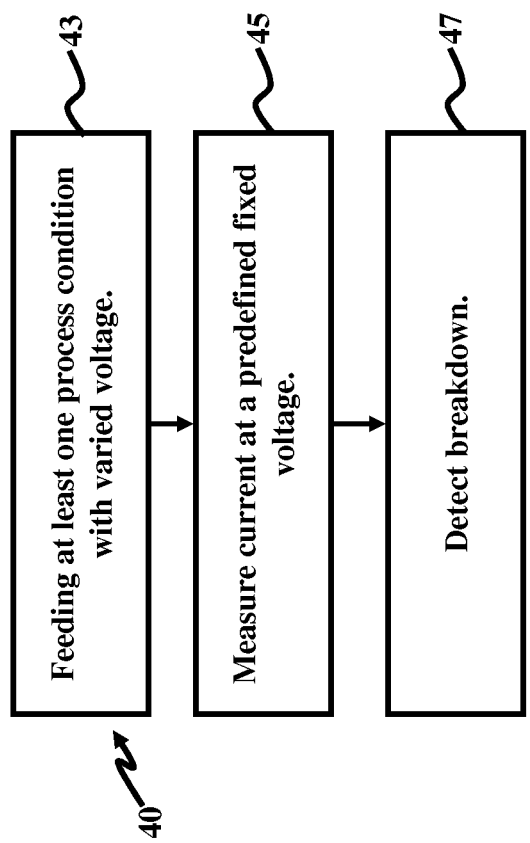

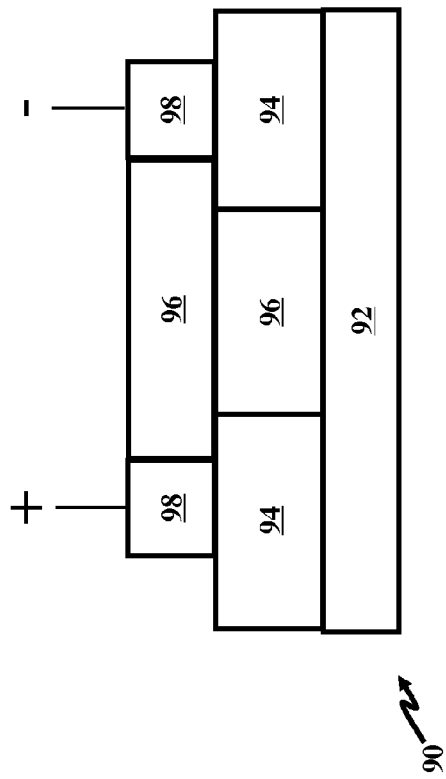
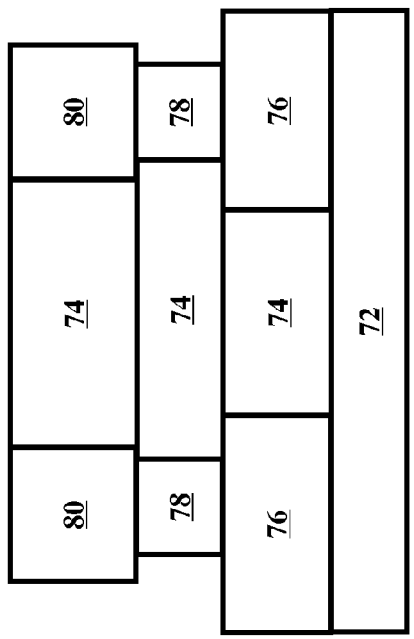

METHOD AND SYSTEM OF IMPROVED RELIABILITY TESTING

BACKGROUND

1. Technical Field

The embodiments herein generally relate to semiconductor processing and characterization, and more specifically, to a high throughput combinatorial characterization tool for combinatorial semiconductor substrates.

2. Description of the Related Art

The ability to process uniformly across a monolithic substrate and/or across a series of monolithic substrates is advantageous for manufacturing efficiency and cost effectiveness, as well as repeatability and control. However, uniform processing across an entire substrate can be disadvantageous when optimizing, qualifying or investigating new materials, new processes, and/or new process sequence integration schemes, since the entire substrate is nominally made the same using the same materials, processes and process sequence integration schemes. Each processed substrate generally represents, in essence, only one possible variation per substrate. Thus, the full wafer uniform processing under conventional processing techniques results in fewer data points per substrate, longer times to accumulate a wide variety of data, and higher costs associated with obtaining such data.

For example, the lifetime and reliability characteristics are very important specifications for any new or existing product. Lifetime and reliability tests are usually tested with accelerated conditions such as high temperature, voltage, longer time, etc. Voltage Breakdown (VBD) and Time Dependent Dielectric Breakdown (TDDB) are the two main reliability tests for back end of line (BEOL) applications. However, as a current industrial standard, VBD and TDDB are performed at the package level or wafer level with at least four metal pattern layers. To evaluate a process at a first metal (M1) layer, one wafer with M1 exposed is processed by a single process condition and then passivated with a cap layer such as SiN. Then, several subsequent layers are deposited and patterned. Afterwards, the VBD and TDDB tests are performed. Moreover, using conventional technology, a wafer can generally only be used to evaluate a single process condition. This unit process and test workflow used in current industry is complicated, time consuming, and not cost efficient.

Moreover, wafer level TDDB, especially at the M1 layer is generally not well understood and not typically used commercially in the industry. Currently, each process is performed one wafer at M1 or higher layer. Then, the wafer is passivated and at least four more layers are deposited, or the wafer even is packaged, and then reliability testing is performed. To know the result of each condition, one wafer with many follow-up steps is required, which under current technology is very complicated as well as cost inefficient. In particular, semiconductor companies conduct research and development (R&D) on full wafer processing through the use of split lots, as the deposition systems are designed to support this processing scheme. This approach has resulted in high R&D costs and the inability to conduct extensive experimentation in a timely and cost effective manner.

BRIEF DESCRIPTION OF THE DRAWINGS

The embodiments herein will be better understood from the following detailed description with reference to the drawings, in which:

FIG. 1C illustrates a combinatorial process according to an embodiment herein;

FIG. 2A illustrates a flowchart for a VBD test according to an embodiment herein;

FIG. 6A illustrates a schematic diagram of a first TDDB test apparatus according to an embodiment herein;

FIG. 6B illustrates a schematic diagram of the TDDB test apparatus shown in FIG. 5A according to an embodiment herein;

DETAILED DESCRIPTION

Figure 1A:
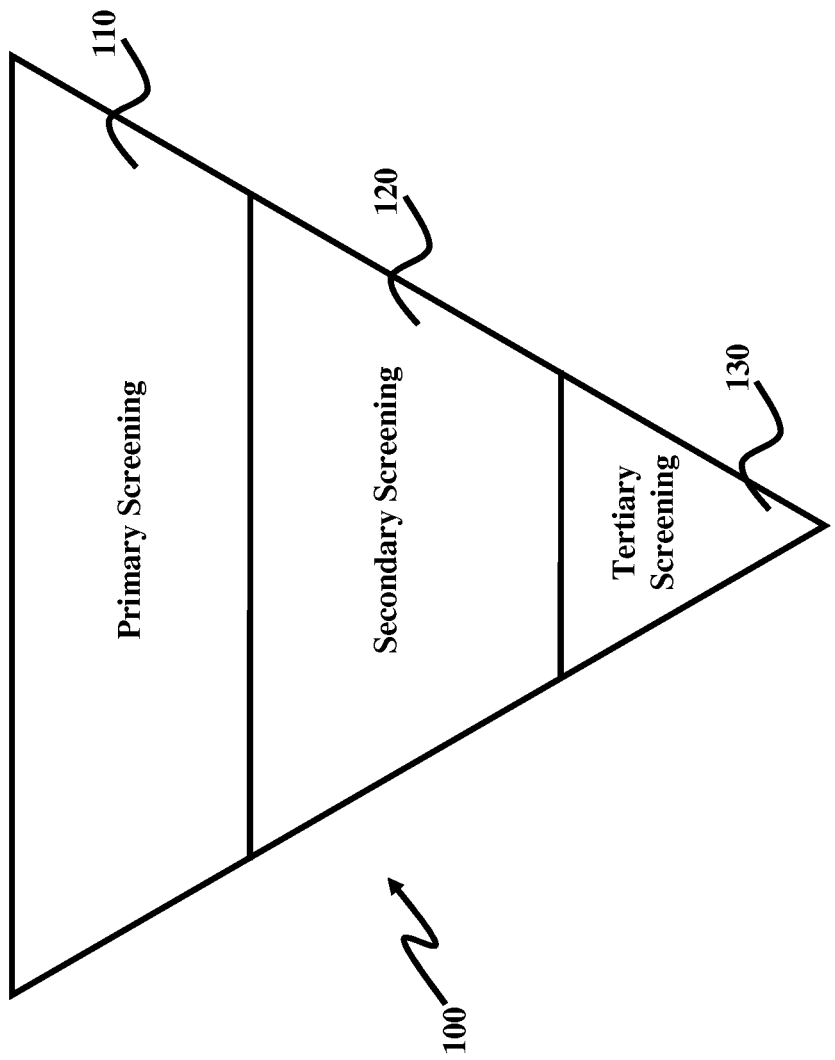
FIG. 1A illustrates a schematic diagram of a combinatorial screening process according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Referring now to the drawings, and more particularly to FIGS. 1A through 8, where similar reference characters denote corresponding features consistently throughout the figures, there are shown embodiments herein. The manufacturing of semiconductor devices, integrated circuits (IC) devices, microelectromechanical systems (MEMS), nanoelectromechanical systems (NEMS), flat panel displays, optoelectronics devices, data storage devices, magneto electronic devices, magneto optic devices, packaged devices, solar devices, and the like entails the integration and sequencing of many unit processing steps. For example, IC manufacturing typically includes a series of processing steps such as cleaning, surface preparation, deposition, lithography, patterning, etching, planarization, implantation, thermal annealing and other related unit processing steps. The precise sequencing and integration of the unit processing steps enable the formation of functional devices meeting desired performance specifications such as speed, power consumption, yield and reliability. Furthermore, the tools and equipment employed in device manufacturing have been developed to enable the processing of ever increasing substrate sizes such as the move to twelve inch (or 300 millimeter) diameter wafers in order to fit more ICs per substrate per unit processing step for productivity and cost benefits. Other methods of increasing productivity and decreasing manufacturing costs include the use of batch reactors whereby multiple monolithic substrates can be processed in parallel. In these processing steps, a monolithic substrate or batch of monolithic substrates are processed uniformly; i.e., in the same fashion with the same resulting physical, chemical, electrical, and the like properties across a given monolithic substrate.

The embodiments herein support and enable efficient combinatorial processing. For example, in an embodiment described below, combinatorial processing provides rapid evaluation of semiconductor processing operations. Some exemplary semiconductor processing operations include operations for adding (depositions) and removing layers (etching), defining features, preparing layers (e.g., cleans), doping, etc. In such an embodiment, the systems supporting the combinatorial processing are flexible to accommodate the demands for running the different processes either in parallel, serial or some combination of the two.

As used herein, combinatorial processing may include any processing (e.g., semiconductor processing) that varies the processing conditions in two or more regions of a substrate. A substrate may be, for example, a silicon substrate such as a wafer that is used in semiconductor processing. A region of a substrate may be any portion of the substrate that is somehow defined, for example by dividing the substrate into regions having predetermined dimensions or by using physical barriers, such as sleeves, over the substrate. The region may or may not be isolated from other regions. For example, a substrate may be divided into two or more regions, each of which may or may not include semiconductor device structures (e.g., metallization such as interconnects and vias, active elements such as transistors, etc.). A process may be performed at each of the regions. For example, a first region is cleaned using a first cleaning agent, and a second region is cleaned using a second cleaning agent. The efficacies of the two cleaning agents are evaluated, and none, one, or both of the cleaning agents may be selected as suitable candidates for larger scale processing (e.g., on regions with structures, regions enabling more sophisticated testing, or a full wafer). According to other examples, multiple iterations of the same experiment are performed on the same substrate, and any number of regions may be defined. For example, five cleaning solutions may be tested using fifteen regions of a substrate, each cleaning solution being tested three times.

As described above, combinatorial processing, when applied to semiconductor manufacturing operations, enables multiple experiments to be performed on a single substrate. Equipment for performing the combinatorial processing and characterization of the combinatorial test substrates must support the efficiency offered through the combinatorial processing operations. Consequently, a valuable, quick, and efficient combinatorial processing component is the characterization tool(s) used to produce the data from the high throughput experimentation in such a way that the process does not slow down.

For example, the process of forming test substrates to combinatorially test materials, processes, and devices is described herein. Combinatorial processing enables multiple experiments to be performed on a single substrate and the rapid evaluation of semiconductor processing operations and materials. The test substrates are designed to run the different combinatorial processes either in parallel, serial, or some combination of the two. These methodologies all incorporate the formation of site-isolated regions using a combinatorial processing tool and the use of these site-isolated regions to form the test area. Therefore, multiple regions/test areas may be rapidly formed on a single substrate for use in combinatorial methodologies. Any of the individual processes of the methods described may be varied combinatorially to test varied process conditions or materials.

Use of combinatorial-based rapid device prototyping methods permits fabrication, comprehensive characterization, and analysis of hundreds of unique devices (e.g., semiconductor devices) and systems (e.g., MEMS) on a weekly basis to dramatically increase productivity and learning rates. For example, knowledge about alternative device structures, process integration schemes, and material compositions can be systematically explored at speeds that would otherwise be impossible using traditional methods and tools.

As described above, during one embodiment of combinatorial processing, each wafer is subjected to many different process conditions. FIG. 1A illustrates an example of such a combinatorial screening process. As shown in FIG. 1A, combinatorial screening process 100 includes primary screening process (110), secondary screening process 120, and tertiary screening process (130). In FIG. 1A, for example, numerous material compositions (e.g., 18 spots or 46 spots on a single wafer, where each spot is a unique material composition) are systematically explored on a single wafer during an initial primary screening process (110) at speeds that would otherwise be impossible using traditional methods and tools. In other words, in the embodiment shown in FIG. 1A, the primary screening process (110) is an initial screening that processes many samples (e.g., using blanket deposition of a copper film) to rule out materials for further screening. Once the best materials, process conditions, or process integration are identified using initial combinatorial screening methods (e.g., during primary screening process (110)), that material is then scaled up to test the reliability of that material and/or conditions during a secondary screening stage (e.g., secondary screening process (120)). Furthermore, according to one embodiment herein, additional testing may take place during tertiary screening process (130). During tertiary screening process (130), for example, the materials and/or process conditions that were not filtered out during primary screening process (110) and secondary screening process (120) are scaled up to a device size. Furthermore, due to the speed and non-destructiveness of the reliability test (described in further detail below) occurring in secondary screening process (120), material and/or conditions that pass both the primary screening process (110) and secondary screening process (120) can rapidly proceed to tertiary screening process (130). Consequently, to test the reliability of these material compositions, embodiments herein utilize an improved measurement tool to enable the collection information more rapidly.

Contrary to conventional systems (e.g., traditional accelerated life test (ALT)), one embodiment herein includes an ALT during back end of line processing (BEOL) of a wafer, where the first metal layer (i.e., M1 layer) is exposed. The term "BEOL" or back end of line processing, as used herein, generally refers to a stage(s) of production of a semiconductor chip after the first metallization. As such, the term "first metal layer" or "M1 layer" (may also be referred to as "BEOL levels"), as used herein, generally refers to portions; i.e., levels and/or layers, associated with a semiconductor chip after first metallization.

For example, after combinatorial processing of material compositions on a single wafer, there is no subsequent passivation or metal pattern layer in one embodiment described herein and an ALT (e.g., VBD and/or TDDB) is directly performed with the M1 layer still exposed. Such a technique is not possible in conventional processes given the testing parameters used in conventional solutions. Moreover, in one embodiment described herein, the combinatorial processing described above includes parametric testing (e.g., leakage, resistance, and capacitance tests) of material compositions (e.g., process conditions) on a single wafer and is performed as a first stage of screening. Thereafter, the material compositions that do not meet a pre-determined set of requirements are filtered and removed from further consideration.

As used herein, reliability is the probability that a system (component, etc.) can successfully perform its intended functions, within stated conditions, for a specified period of time.

Figure 1B:
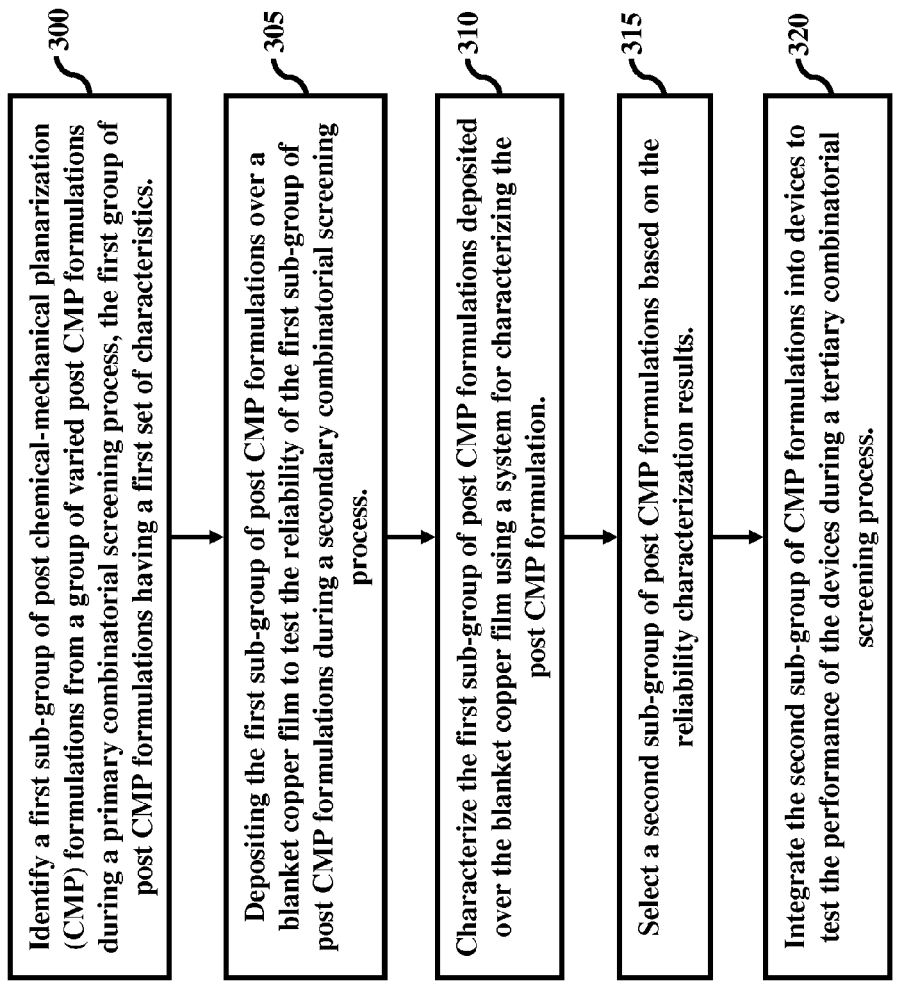
FIG. 1B illustrates a flowchart for a combinatorial testing method according to an embodiment herein.
Figure 8:
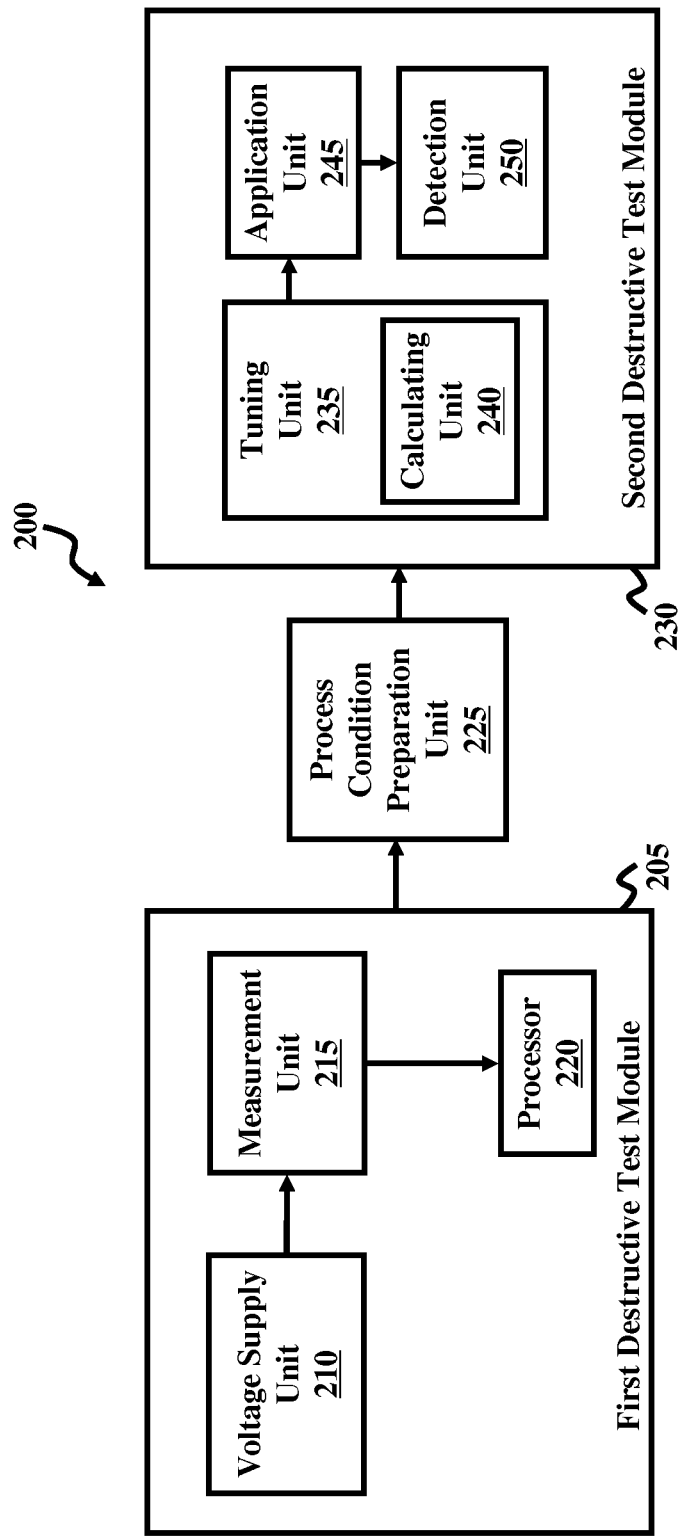
FIG. 8 illustrates a schematic diagram of a test system according to an embodiment herein.

FIG. 1B, with reference to FIGS. 1A and 8, illustrates a flow diagram of a combinatorial testing method according to embodiments herein. According to one embodiment herein, FIG. 1B illustrates a method of processing that includes a step (300) of identifying a first sub-group of post chemical-mechanical planarization (CMP) formulations from a group of varied post CMP formulations during a primary combinatorial screening process, the first group of post CMP formulations having a first set of characteristics. The next step (305) involves depositing the first sub-group of post CMP formulations over a blanket copper film to test the reliability of the first sub-group of post CMP formulations during a secondary combinatorial screening process. Thereafter, step (310) includes characterizing the first sub-group of post CMP formulations deposited over the blanket copper film using a system 200 (as shown in FIG. 8) for characterizing the post CMP formulation, where the system 200 includes a first destructive test module 205 adapted to conduct a first destructive test at room temperature on a first substrate comprising only a first metallization layer, and a second destructive test module 230 adapted to conduct a second destructive test at the room temperature on a second substrate comprising only a first metallization). The next step (315) involves selecting a second sub-group of post CMP formulations based on the reliability characterization results. Finally, step (320) provides integrating the second sub-group of CMP formulations into devices to test the performance of the devices during a tertiary combinatorial screening process (e.g., tertiary screening process (130) of FIG. 1A).

FIG. 1C, with reference to FIGS. 1A, 1B, 2A and 4, illustrates a combinatorial process according to an embodiment herein. As shown in FIG. 1C, combinatorial process 1 includes process conditions 10, a first screening stage 20, a second screening stage 30, and a results stage 35. According to one embodiment herein, multiple process conditions 10 are on a single wafer or test coupon and include gradient processing techniques that rely on the inherent non-uniformity of the material deposition. In other words, the embodiments herein may vary the substrate, the materials, processes and process sequences over the entire substrate. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are unknown, however, a portion of the regions, normally at least 60% or more of the area, is uniform and all testing occurs within that region. Further, the potential overlap is only allowed with materials of processes that will not adversely affect the result of the tests. Both types of regions are referred to herein as regions or discrete regions.

Moreover, according to one embodiment herein, first screening stage 20 includes parametric testing and voltage breakdown. Parametric testing, according to one embodiment herein, includes at least one of leakage, resistance, and capacitance tests. In addition, the VBD reports the highest voltage before breakdown (BD). According to one embodiment herein, VBD is performed on the leftover good process (e.g., after the parametric tests have been performed) as an additional screening. As described above with respect to FIG. 1A, first screening stage 20 is an example of primary screening process 110 and process conditions 10 are filtered into "good" processes and "bad" processes during first screening stage 20, where good processes are defined as meeting some predetermined desirable goal, and bad processes are defined as not meeting that same predetermined desirable goal or simply not performing as well as the good processes. Thereafter, the filtered few good processes are applied to the wafer or test coupon with more repeats (i.e., with a high number of applications to the wafer or test coupon) and the second screening stage 30 is performed. According to one embodiment herein, second screening stage 30 includes a TDDB test. After second screening stage 30, the results of both first screening stage 20 and second screening stage 30 are sent to results stage 35 for later use. Combinatorial process 1 is very fast and cost efficient in finding the few good process conditions out of many possible process conditions.

It should be appreciated that various other combinations of conventional and combinatorial processes can be included in the processing sequence with regard to FIG. 1C. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates (e.g., wafers) or portions of monolithic substrates (e.g., as test coupons or wafer coupons).

In FIG. 1C, the VBD and TDDB tests are two reliability tests in the first and second screening stages 20, 30, respectively, of combinatorial process 1. Furthermore, since both the VBD and TDDB tests are destructive, they present a significant lag in conventional testing. To enable higher throughput and greater efficiency, when compared to a conventional VBD test and TDDB test, VBD test 40 (shown in FIG. 2A) in first screening stage 10 and TDDB test 60 (shown in FIG. 5A) in second screening stage 20 are different from standard testing by performing the respective tests at the M1 layer. To further improve throughput and greater efficiency, these tests are exposed after each stage of processing (e.g., process conditions 10, first screening stage 20, and second screening stage 30) during the subsequent tests. As described in further detail below, VBD test 40 and TDDB test 60 are significantly faster and more efficient than conventional testing. While conventional testing suffers from environment factors and poor signal-to-noise ratio (SNR) in the data; VBD test 40 and TDDB test 60 overcome these difficulties faced by conventional tests by using a test procedure and unique test condition that is selectively determined to enhance the signal of each respective test to be able to differentiate processes. For example, during one embodiment of such a test procedure, current is monitored and analyzed at each step (e.g., voltage increase) to determine the voltage just before breakdown (i.e., VBD). Breakdown is signaled by applying a predefined set of detection and optimization algorithms at each measurement cycle. If a breakdown occurs, given the test progress and detection algorithm used, a specific failure mode will be registered. If no breakdown occurs the test will continue varying until a maximum voltage is reached.

As described below, current in process conditions 10 are detected during a VBD test (e.g., as part of screening stage 20) and/or a TDDB test (e.g., as part of screening stage 30) and the respective test is stopped if a breakdown is detected. Furthermore, embodiments herein provide the choice of breakdown conditions; for example, a combination of two current conditions (e.g., a stress or a predetermined fixed condition), two polarity (e.g., current increases or decreases), and four curve change criteria (e.g., magnitude, slope, etc.). As discussed below, VBD tests and TDDB tests according to embodiments herein are more sensitive in detecting breakdown when it occurs.

FIG. 2A, with reference to FIGS. 1A and 1C, illustrates a flowchart for a VBD test 40. As shown in FIG. 2A, VBD test 40 includes feeding one or more process conditions 10 with varied voltage at step (43). In one embodiment, the method shown in FIG. 2A increases the varied voltage by 0.5 volts every 5 seconds. Next, at step (45), the current is measured at a predefined fixed voltage (e.g., 1 volt). With current always measured at fixed voltage instead of at the varied voltage, the sensitivity of detecting current change in VBD test 40 (such as voltage breakdown) is greatly enhanced. Step (47) of VBD test 40 detects a voltage breakdown (e.g., of process conditions 10).

Figure 2B:
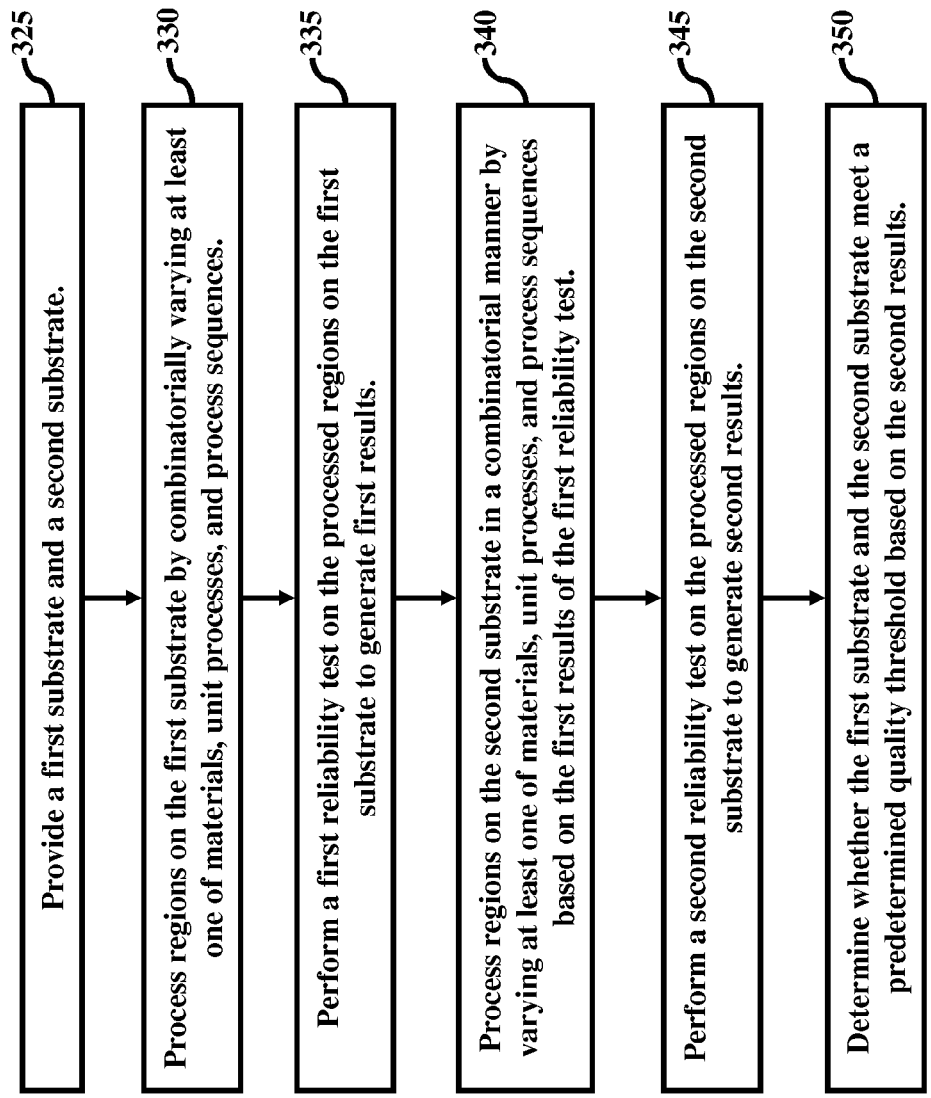
FIG. 2B illustrates a flowchart of a test method according to an embodiment herein.

FIG. 2B, with reference to FIGS. 1A through 2A, illustrates a flowchart of a testing method according to the embodiments herein. According to one embodiment herein, the method shown in FIG. 2B is for evaluating materials, unit processes, and process sequences for manufacturing a device and includes providing (325) a first substrate and a second substrate, each substrate comprising only a first metallization layer; processing (330) regions on the first substrate by combinatorially varying at least one of materials, unit processes, and process sequences; performing (335) a first reliability test on the processed regions on the first substrate to generate first results; processing (340) regions on a second substrate in a combinatorial manner by varying at least one of materials, unit processes, and process sequences based on the first results of the first reliability test; performing (345) a second reliability test on the processed regions on the second substrate to generate second results; and determining (350) whether the first substrate and the second substrate meet a predetermined quality threshold based on the second results.

Figure 3:
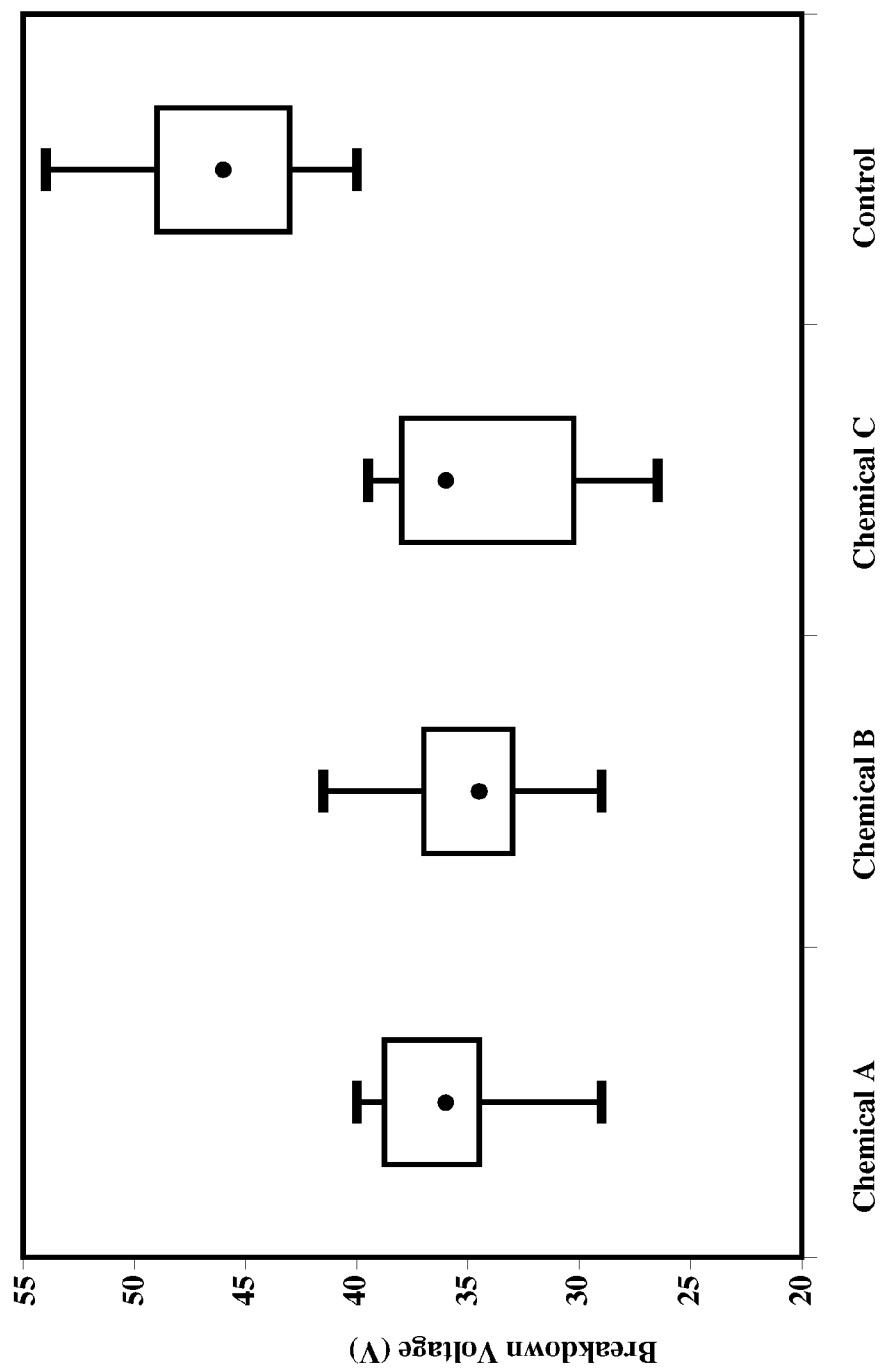
FIG. 3 illustrates sample data for the VBD test shown in FIG. 2A according to an embodiment herein.

FIG. 3, with reference to FIGS. 1A through 2B, illustrates sample data for VBD test 40. The sample voltage breakdown data shown in FIG. 3 was experimentally taken from different chemical process (e.g., process conditions 10, shown in FIG. 1C) on a 400AZ wafer (e.g., as provided by SVTC Technologies LLC, San Jose, Calif., USA) with M1 layer exposed and no cap (e.g., without an SiN cap). Subsequent analysis may reveal, for example, that compared to a water control process, the chemical processes undergoing testing (e.g., Chemical A, Chemical B, and Chemical C) will have lower voltage breakdown and worse reliability. In addition, since the reliability of Chemicals A, B and C are relatively comparable, the secondary screening stage 30 (shown in FIG. 1C) would follow VBD test 40 with a TDDB test (as described in further detail below).

Figure 4A:
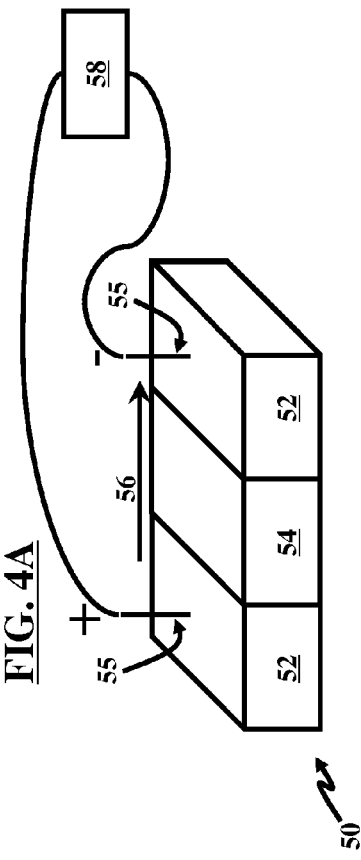
FIG. 4A illustrates a schematic diagram of a VBD test device according to an embodiment herein.
Figure 4C:
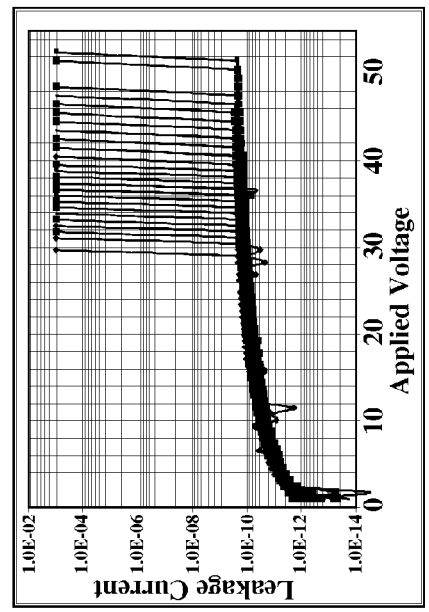
FIG. 4C illustrates additional sample data of the VBD test device shown in FIG. 4A according to an embodiment herein.
Figure 4B:
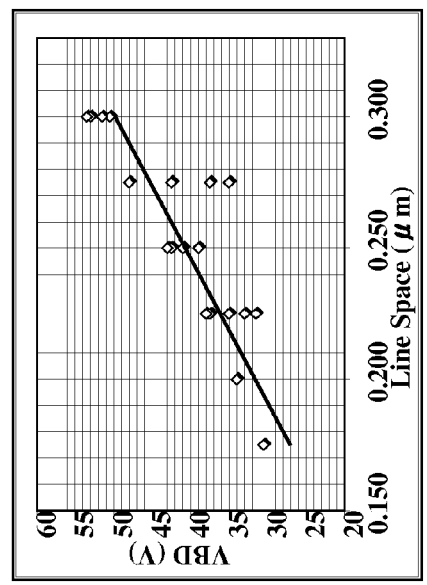
FIG. 4B illustrates sample data of the VBD test device shown in FIG. 4A according to an embodiment herein.

FIG. 4A, with reference to FIGS. 1A through 3, illustrates a schematic diagram of VBD test 40 (of FIG. 2A). As shown in FIG. 4A, VBD test device 50 includes M1 layer 52, insulator/dielectric 54 (e.g., silicon dioxide or other oxides), line space 56 (i.e., the length between adjacent M1 layers 52 (e.g., copper)), and a power supply 58. As shown, electrical leads 55 to the power supply 58 are first connected to the pair of M1 layers 52 separated by insulator/dielectric 54. Next a voltage is applied, and finally a measurement is taken with any appropriate reader (not shown) used by those skilled in the art. FIGS. 4B and 4C, with reference to FIGS. 1A through 4A, illustrate the sample data of the VBD test 40 shown in FIG. 4A. In the example data shown in FIGS. 4B and 4C, the device 50 comprises a 400AZ wafer (e.g., as provided by SVTC Technologies LLC), the line space 56 is between approximately 0.175 μm and 0.3 μm. In addition, the voltage scan is between approximately 0 and 100 volts, at approximately 0.05V per step, and the temperature is approximately 25° C. Given the values illustrated and the relatively flat curve of leakage current (until reaching approximately 30 volts), FIGS. 4B and 4C would not be possible using conventional methods and are only achievable using the techniques provided by the embodiments herein.

Figure 5A:
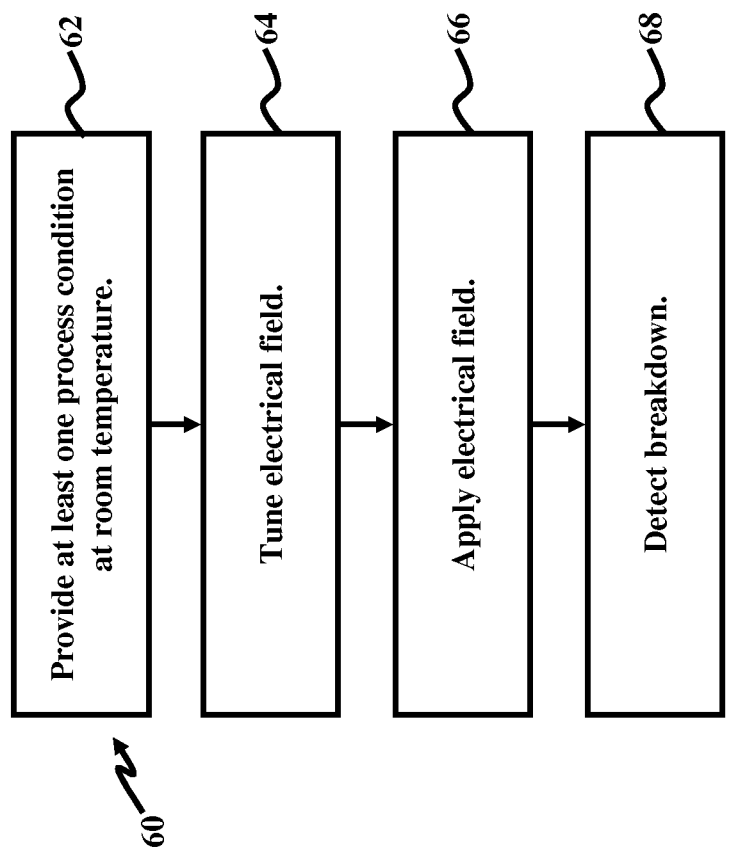
FIG. 5A illustrates a flowchart of a TDDB test according to an embodiment herein.

FIG. 5A with reference to FIGS. 1A through 4C, illustrates a flowchart of the TDDB test 60. Step (62) of the method shown in FIG. 5A includes providing at least one process condition (e.g., on a test coupon or a wafer) at room temperature (e.g., within a testing apparatus, not shown). Step (64) tunes the electrical field to a precise level (as described in further detail below), and the electrical field is applied in step (66). For example, according to one embodiment herein, an initial stress electrical field is set to 77% of VBD (e.g., according to VBD test 40 shown in FIG. 2A). Step (68) of the method shown in FIG. 4 detects a breakdown in the process condition. A breakdown occurs, for example, due to the heat generated by conduction (e.g., applied electrical field in step (66)), which leads to mechanical degradation/damage and eventually to the formation of traps in the process condition material. As these traps form over time, they become larger and eventually cause the conductivity of the material to breakdown, thereby causing an electrical breakdown of the material. When using a conventional TDDB test and with the M1 layer exposed, the M1 layer (e.g., a Cu layer) oxidizes when the sample is heated up to the temperature required for the traditional test. In contrast, the TDDB test 60 is a unique room temperature TDDB test, which performs a TDDB test 60 under room temperature instead of an elevated temperature, as described above. Such a reduction in room temperature is possible by increasing the voltage being applied. Simply increasing the voltage in conventional testing techniques is not practical, however, because conventional testing does not accommodate for the added noise introduced by simply increasing the voltage. As described below, embodiments herein resolve the introduction of additional noise by increasing the signal resolution.

Figure 5B:
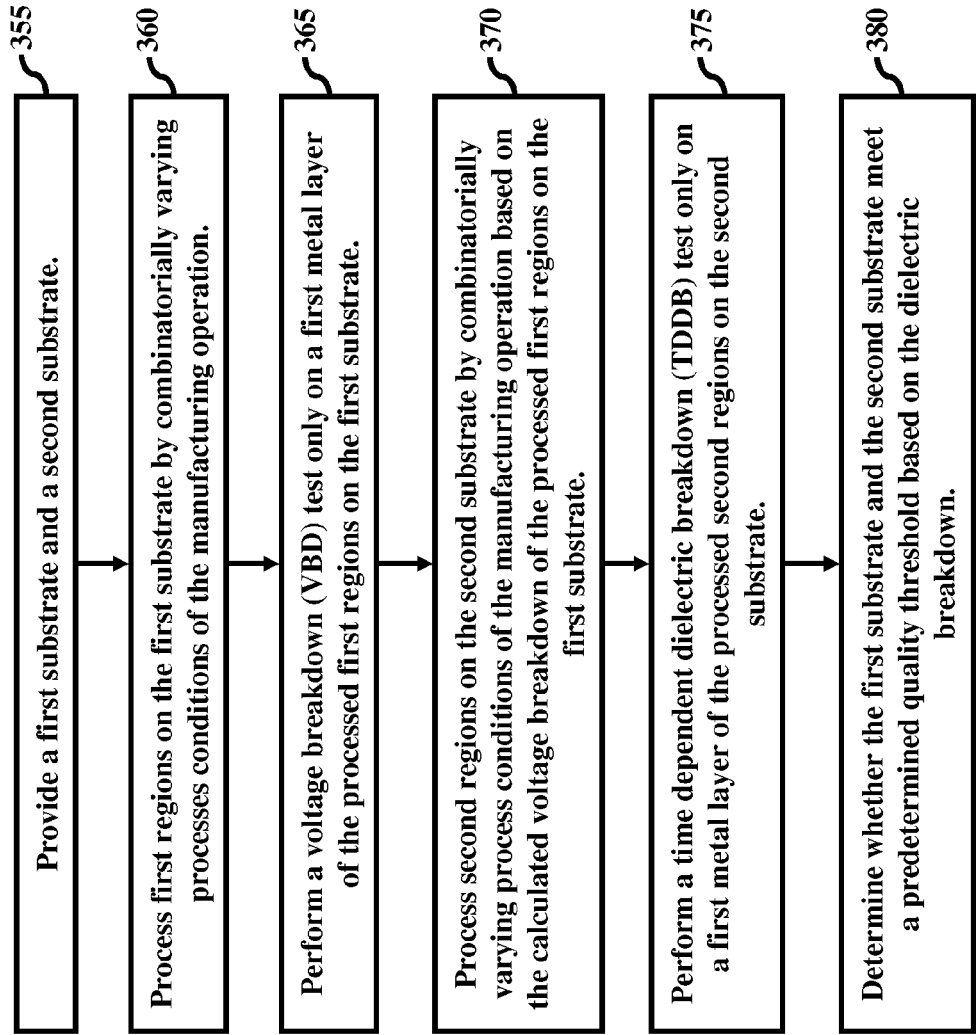
FIG. 5B illustrates a flowchart of an alternative test method according to an embodiment herein.

FIG. 5B, with reference to FIGS. 1A through 5A, illustrates another flowchart of a testing method according to the embodiments herein. According to one embodiment herein, the method shown in FIG. 5B is for evaluating materials, process conditions, and process sequences for a manufacturing operation, where the method includes providing (355) a first substrate and a second substrate; processing (360) first regions on a first substrate by combinatorially varying processes conditions of the manufacturing operation; performing (365) a voltage breakdown (VBD) test only on a first metal layer of the processed first regions on the first substrate where the VBD test may include applying to the processed first regions a varied voltage at room temperature, measuring a current on the processed first regions at a predefined fixed voltage, and calculating a voltage breakdown of the processed first regions from the measured current).

Next, the method shown in FIG. 5B involves processing (370) second regions on the second substrate by combinatorially varying process conditions of the manufacturing operation based on the calculated voltage breakdown of the processed first regions on the first substrate; performing (375) a time dependent dielectric breakdown (TDDB) test only on a first metal layer of the processed second regions on the second substrate where the TDDB test may include tuning an electrical field adjacent to the second substrate, applying the electrical field to the processed second regions, and detecting a dielectric breakdown of the processed second regions; and determining (380) whether the first substrate and the second substrate meet a predetermined quality threshold based on the dielectric breakdown.

FIG. 6A, with reference to FIGS. 1A through 5B, illustrates a schematic diagram of a first TDDB test. As shown in FIG. 6A, device 70 includes substrate 72, M1 layer 74, dielectrics 76, via 78, and M2 layer 80. FIG. 6B, with reference to FIGS. 1A through 6A, illustrates a schematic diagram of TDDB test 60 (of FIG. 5A). As shown in FIG. 6B, device 90 includes substrate 92, M1 layer 94, dielectrics 96, and via 98. Notably, device 90 does not include an M2 layer. To compensate for the higher temperature, which operates an acceleration factor in FIG. 6A, a higher electrical field is tuned (e.g., step (64), shown in FIG. 5A) and applied (e.g., step (66), shown in FIG. 5A) is used as an acceleration factor in FIG. 6B. In addition, a longer detection window in FIG. 6B operates as a second acceleration factor to allow the longer stress time (e.g., when applying the electrical field in step (66)) and helps enhance a breakdown signal.

Figure 7:
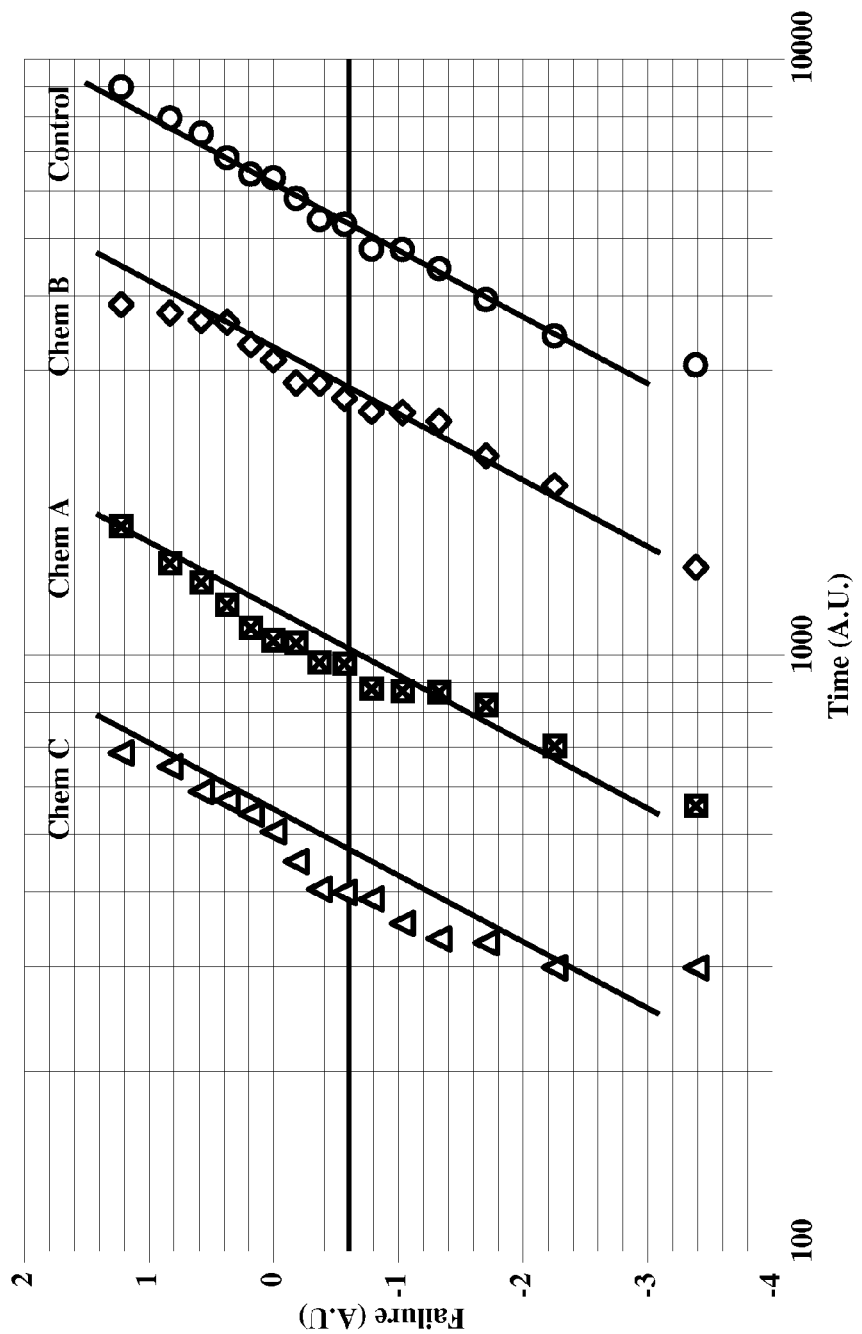
FIG. 7 illustrates sample data for the TDDB test shown in FIG. 5A according to an embodiment herein.

FIG. 7, with reference to FIGS. 1A through 6B, illustrates sample data for TDDB test 60 (of FIG. 5A) using test device 90 (of FIG. 6B). In the embodiment tested in FIG. 7, the tuned and applied stress electrical field is approximately 1.4 MV/cm (e.g., steps (64) and (66) in FIG. 5A) and the temperature is approximately 25° C. (e.g., step (62) in FIG. 5A). In addition, the maximum stress time is set to 10,000 seconds and a current measurement is taken approximately every 5 seconds, for example. The wafer is a 400AZ wafer, for example (e.g., as provided by SVTC Technologies LLC) and the Cu line space is between approximately 0.175 μm and 0.3 μm. Moreover, the number of devices 90 is twenty for each geometry, for a total of 120 devices.

FIG. 8, with reference to FIGS. 1A through 7, illustrates a schematic diagram of a test system 200 according to embodiment herein. As shown in FIG. 8, test system 200 includes a first destructive test module 205 that further includes a voltage supply unit 210, a measurement unit 215, and a processor 220. Test system 200 further includes a process condition preparation unit 225 and a second destructive test unit 230, which includes tuning unit 235, an application unit 245, and a detection unit 250. According to one embodiment herein, first destructive test module 230 is adapted to conduct a first destructive test (e.g., VBD test 40 (shown in FIG. 2A)) at room temperature on a first substrate (e.g., substrate 72 shown in FIG. 6A) comprising only a first metallization layer (e.g., M1 94 shown in FIG. 6A). As shown in FIG. 8, the first destructive test module 205 includes voltage supply unit 210 adapted to feed the process condition with a varied voltage at the room temperature, measurement unit 215 operatively connected to the voltage supply unit 210 and adapted to measure a current on the processed first regions at a predefined fixed voltage, and processor 220 operatively connected to the measurement unit 215 and adapted to calculate a voltage breakdown of the processed first regions from the measured current. Furthermore, test system 200 includes process condition preparation unit 225 adapted to combinatorially prepare a second process condition by varying process conditions based on the calculated voltage breakdowns of the processed first regions.

Test system 200 is also shown in FIG. 8 to include second destructive test module 230 operatively connected to the process condition preparation unit 225 and adapted to conduct a second destructive test (e.g., TDDB test 60 (shown in FIG. 5A)) at the room temperature on a second substrate (e.g., substrate 92 shown in FIG. 6B) comprising only a first metallization layer (e.g., M1 94 shown in FIG. 6B). The second destructive test module 230 is shown in FIG. 8 to include the tuning unit 235 adapted to tune an electrical field, application unit 245 operatively connected to the tuning unit 235 and adapted to apply the electrical field to the second process condition, and the detection unit 250 operatively connected to the application unit 245 and adapted to detect a breakdown of the second process condition.

According to such an embodiment, the room temperature may be approximately 25° C. Furthermore, the first destructive test module 205 may comprise a voltage breakdown test and the second destructive test module 230 may comprise a time dependent dielectric breakdown test. In addition, tuning unit 235 may include a calculating unit 240 adapted to calculate a predetermined percentage of the voltage breakdown, wherein the tuning unit 235 is adapted to tune the electrical field to the calculated predetermined percentage. In addition, the first destructive test (e.g., as performed by first destructive test module 205) may be performed only on the first metallization layer (e.g., M1 layer 74 shown in FIG. 6B) of the first substrate (e.g., substrate 72 shown in FIG. 6A) and the second destructive test (e.g., as performed by the second destructive test module 230) may be performed only on the first metallization layer (e.g., M1 94 shown in FIG. 6B) of the second substrate (e.g., substrate 92 shown in FIG. 6B).

One embodiment of the combinatorial screening process described above (e.g., FIGS. 1A and 1C) enables multiple experiments to be performed on a single substrate and the rapid evaluation of semiconductor processing operations and semiconductor materials. The semiconductor test substrates are designed to run the different combinatorial processes either in parallel, serial, or some combination of the two. For example, embodiments herein allow forming different types of semiconductor devices that can be combinatorially varied and evaluated. These methodologies all incorporate the formation of site-isolated regions using a combinatorial processing tool and the use of these site-isolated regions to form the semiconductor area. Therefore, multiple semiconductor devices may be rapidly formed on a single substrate for use in combinatorial methodologies. Any of the individual processes of the methods described may be varied combinatorially to test varied process conditions or materials.

The use of combinatorial-based rapid device prototyping methods (e.g., as shown in FIGS. 1A and 1C) permits fabrication, comprehensive characterization, and analysis of hundreds of unique semiconductor devices on a weekly basis to dramatically increase learning rates. Alternative device structures, process integration schemes, and materials compositions are systematically explored at speeds that would otherwise be impossible using traditional methods and tools. This pace of development applied to Earth Abundant thin film photovoltaic (PV) devices may represent an order of magnitude acceleration of R&D in this area.

The embodiments herein improve the combinatorial screening of post chemical-mechanical planarization (CMP) formulations (e.g., in copper/low-k cleaning) and the characterization of copper-derived compounds (e.g., CZTS) after the application of those formulations. For example, during an initial screening (e.g., primary screening process (110) shown in FIG. 1A), many samples (e.g., post CMP formulations) are tested by using blanket copper test wafers (e.g., as supplied by Advantiv Technologies, Inc. Fremont Calif., USA). This initial screening may have a simple criteria (e.g., <5% thickness loss on oxide, Cu after chemical treatment) to allow a quick evaluation and thereby quickly rule out materials that will not undergo the second stage of testing (e.g., in secondary screening process (120) shown in FIG. 1A). During the secondary screening process (120) shown in FIG. 1A, a variety of more specific characterization methods may be performed on the test cleaning formulations identified in primary screening process (110) on fabricated patterned/metallized surfaces. Such characterization methods include parametric tests and reliability tests. Sample criteria to evaluate such post CMP cleaning formulations include, but are not limited to: a<2 order leakage increase, a<10% resistance increase, a<10% capacitance increase, a<20% Vbd decrease and a<5× degradation in $t_{0.63}$. After performing such characterization methods on the post CMP formulations, those formulations which pass a certain criteria (e.g., the sample criteria discussed above) are then passed on to a tertiary screening process (130) that scales the post CMP formulation to actual devices.

Generally, the embodiments herein provide the ability to more efficiently screen and analyze an array of materials, processes, and process sequence integration schemes across a substrate in order to more efficiently evaluate alternative materials, processes, and process sequence integration schemes for semiconductor manufacturing processes. Moreover, the embodiments herein provide high performance combinatorial characterization tools that quickly process and characterize combinatorial test substrates.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of several embodiments, those skilled in the art will recognize that the embodiments herein can be practiced with modification within the spirit and scope of the appended claims.

What is claimed is:

1. A method for evaluating materials, unit processes, and process sequences for manufacturing a device, said method comprising:
   providing a first substrate and a second substrate, each substrate comprising only a first metallization layer;
   processing regions on said first substrate by combinatorially varying at least one of materials, unit processes, and process sequences;
   performing a first reliability test on said processed regions on said first substrate to generate first results;
   processing regions on said second substrate in a combinatorial manner by varying at least one of materials, unit processes, and process sequences based on said first results of said first reliability test;
   performing a second reliability test on said processed regions on said second substrate to generate second results; and
   determining whether said first substrate and said second substrate meet a predetermined quality threshold based on said second results.

2. The method of claim 1, wherein at least one of said first reliability test and said second reliability test comprise at least one of a voltage breakdown (VBD) test and a time dependent dielectric breakdown (TDDB) test.

3. The method of claim 2, wherein said VBD test and said TDDB test are conducted at approximately 25° C.

4. The method of claim 2, wherein said first reliability test on said first substrate comprises said VBD test and said VBD outputs a breakdown voltage as said first results.

5. The method of claim 4, wherein said VBD test comprises:
   applying to said first substrate a varied voltage at approximately 25° C.;
   measuring a current on said first substrate at a predefined fixed voltage; and
   calculating a voltage breakdown of said first substrate from said measured current.

6. The method of claim 4, wherein said second reliability test on said second substrate comprises said TDDB test, and wherein said TDDB test operates at approximately 25° C.

7. The method of claim 6, wherein said TDDB test comprises:
   tuning an electrical field adjacent to said second substrate;
   applying said electrical field to said second substrate; and
   detecting a breakdown of said second substrate.

8. The method of claim 7, wherein said tuning an electrical field adjacent to said second substrate comprises:
   calculating a predetermined percentage of said voltage breakdown; and
   tuning said electrical field to said calculated predetermined percentage.

9. The method of claim 1, wherein said first metallization layer of said first substrate and said first metallization layer of said second substrate are exposed and made of a metal.

10. The method of claim 9, wherein said first reliability test on said first substrate is performed only on the first metallization layer of said first substrate and said second reliability test on said second substrate is performed only on the first metallization layer of said second substrate.

11. A method for evaluating materials, unit processes, and process sequences for manufacturing a device, said method comprising:
   providing a first substrate and a second substrate, each substrate comprising only a first metal layer, wherein the first metal layer is exposed;
   processing regions on said first substrate by combinatorially varying at least one of materials, unit processes, and process sequences;
   performing a first reliability test on said first metal layer on said first substrate to generate first results;
   processing regions on said second substrate in a combinatorial manner by varying at least one of materials, unit processes, and process sequences based on said first results of said first reliability test;
   performing a second reliability test on said first metal layer on said second substrate to generate second results; and
   determining whether said first substrate and said second substrate meet a predetermined quality threshold based on said second results.

12. The method of claim 11, wherein the first metal layer is made of copper.

13. The method of claim 11, wherein at least one of said first reliability test and said second reliability test comprise at least one of a voltage breakdown (VBD) test and a time dependent dielectric breakdown (TDDB) test.

* * * * *